United States Patent [19]

McLevige

[11] Patent Number: 4,711,701
[45] Date of Patent: Dec. 8, 1987

[54] SELF-ALIGNED TRANSISTOR METHOD
[75] Inventor: William V. McLevige, Plano, Tex.
[73] Assignee: Texas Instruments Incorporated, Dallas, Tex.
[21] Appl. No.: 908,071
[22] Filed: Sep. 16, 1986
[51] Int. Cl.⁴ .................... H01L 21/306; C23F 1/00; B44C 1/22; C03C 15/00
[52] U.S. Cl. ................................ 437/41; 148/1.5; 148/187; 156/653; 156/656; 156/657; 156/659.1; 156/651; 437/41; 437/245; 437/912
[58] Field of Search ................ 29/571, 576 W, 580, 29/591; 156/650–653, 656, 657, 659.1, 662; 427/88, 89, 91; 357/23.1, 41, 43, 23.9, 47, 65, 67, 34; 148/1.5, 187

[56] References Cited
U.S. PATENT DOCUMENTS

| | | | |
|---|---|---|---|
| 4,387,145 | 6/1983 | Lehrer et al. | 156/653 X |
| 4,503,599 | 3/1985 | Ueyanagi et al. | 29/571 |
| 4,532,004 | 7/1985 | Akiyama et al. | 156/653 |
| 4,561,169 | 12/1985 | Miyazaki et al. | 29/571 |
| 4,569,124 | 2/1986 | Rensch et al. | 29/571 X |
| 4,597,827 | 7/1986 | Nishitani et al. | 156/657 X |

Primary Examiner—William A. Powell
Attorney, Agent, or Firm—Carlton H. Hoel; Leo N. Heiting; Melvin Sharp

[57] ABSTRACT

A method of fabrication for self-aligned gallium arsenide transistors using metal implant masks is disclosed. Preferred embodiments include use of a dummy gate (150) made of aluminum (144) on top of titanium tungsten (142) as an implant mask for source (52) and drain (54) formation with the titanium tungsten (142) undercut so that deposited silicon dioxide (62) will form a self-aligned mask for the gate deposition after the dummy gate (150) is removed.

10 Claims, 13 Drawing Figures

SELF-ALIGNED TRANSISTOR METHOD

STATEMENT AS TO RIGHTS TO INVENTIONS MADE UNDER FEDERALLY SPONSORED RESEARCH AND DEVELOPMENT

The U.S. Government has a paid-up license in this invention and the right in limited circumstances to require the patent owner to license others on reasonable terms as provided for by the terms of Contract No. F33615-84-C-1797, awarded by the U.S. Air Force.

BACKGROUND OF THE INVENTION

1. Field of the Invention

The present invention relates to electronic semiconductor devices, and, more particularly, to methods of fabrication of self-aligned MESFET and vertical bipolar transistors.

2. Description of the Related Art

Metal semiconductor field effect transistors (MESFETs) are commonly used in gallium arsenide (GaAs) digital integrated circuits and one of the factors restricting switching speeds is the parasitic source and drain resistance. The parasitic resistances can be lessened by decreasing the gate-to-source and gate-to-drain distances to much less than 1 $\mu$m; and such small distances typically require some sort of self-alignment of the gate with respect to the source and drain. Similarly, in vertical bipolar transistors (silicon and GaAs) the base resistance limits high frequency response but it can be lessened by decreasing the distance between the emitter and the external base contact. Again, self-alignment of the emitter with respect to the base contact is required for distance much less than 1 $\mu$m.

Several self-alignment method have been proposed. For example, T. Sakai et al, Prospects of SST Technology for High Speed LSI, 1985 IEDM Tech. Digest 18, illustrates a vertical silicon bipolar transistor with emitter and submicron width base electrode, and base and emitter contacts fabricated by a self-aligned technique using only one optical mask. M. Hagio et al, A New Self-Align Technology for Low Noise GaAs MESFET's—Sidewall-Assisted Pattern Inversion Technology —, 1984 IEDM Tech. Digest 194, covers a dummy $SiO_2$ gate with 0.1 $\mu$m of PCVD $Si_3N_4$, implants through the nitride to form the source and drain with the dummy gate and the vertical sidewalls of nitride masking the implant; thus the thickness of the nitride determines the distance from the dummy gate to the source and drain; and lastly the dummy gate is replaced with a Ti/Al gate. K. Yamasaki et al, Self-Align Implantation for n+-Layer Technology (SAINT) for High-Speed GaAs ICs, 18 Elec. Lett. 119 (1982), uses a tri-level resist made of FPM, sputtered silicon dioxide, and photoresist and patterns the top level photoresist to define a dummy gate in the silicon dioxide and FPM; the etching to form the dummy gate undercuts the FPM so the silicon dioxide provides an overhang; the dummy gate (silicon dioxide overhang) masks a source and drain implant which is followed by a second sputtering deposition of silicon dioxide that does get under the overhang; thus when the dummy gate is removed by dissolution of the FPM, the opening the silicon dioxide leads to a metal gate aligned with the source and drain. The distance from gate to source and drain is determined by the undercut of the FPM during the dummy gate formation etch.

However, these self-alignment methods have problems such as complicated multi-level resist processing, tricky $SiO_2$ sidewall isolation, or critical use of high-temperature stable refractory contacts. In particular, the SAINT method has a resist structure that does not stand up well to temperature during the $SiO_2$ sputter deposition and requires a difficult sidewall removal of $SiO_2$ that must avoid undercutting the FPM and etching nitride underneath. One variation that avoids the difficult sidewall $SiO_2$ removal is the substitution of $SiO_2$ evaporation for the second $SiO_2$ sputter deposition; but $SiO_2$ evaporation is itself a difficult step.

SUMMARY OF THE INVENTION

The present invention provides a method of fabrication of self-aligned MESFET and vertical bipolar transistors by use of a dummy gate or emitter made with aluminum overhanging on titanium:tungsten, the aluminum determines source/drain or base implants and the titanium:tungsten determines the gate or emitter.

The use of a two-metal dummy structure solves the problems of a resist dummy structure sensitivity to processing temperatures and of sidewall $SiO_2$ removal leading to undercutting of a resist dummy structure.

BRIEF DESCRIPTION OF THE DRAWINGS

The drawings are schematic for clarity.

DESCRIPTION OF THE PREFERRED EMBODIMENTS

Figure 1:
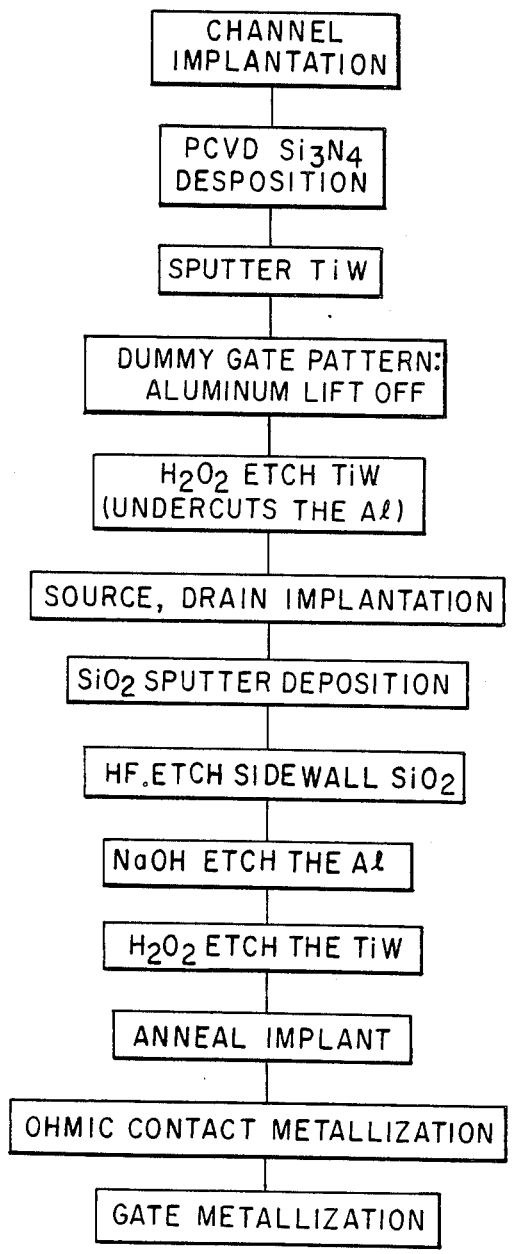
FIG. 1 is a flow graph for a first preferred embodiment method of fabrication.
Figure 2A:
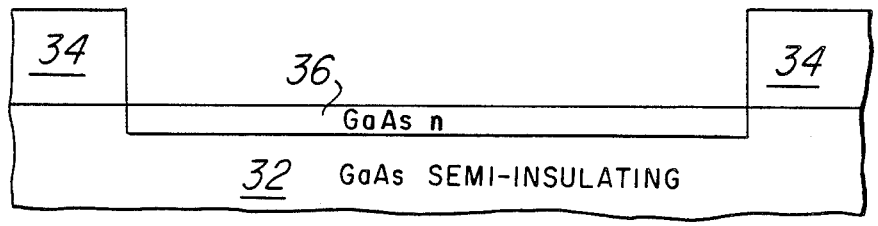
FIGS. 2A-F illustrate the SAINT method in cross sectional elevation view.
Figure 2B:
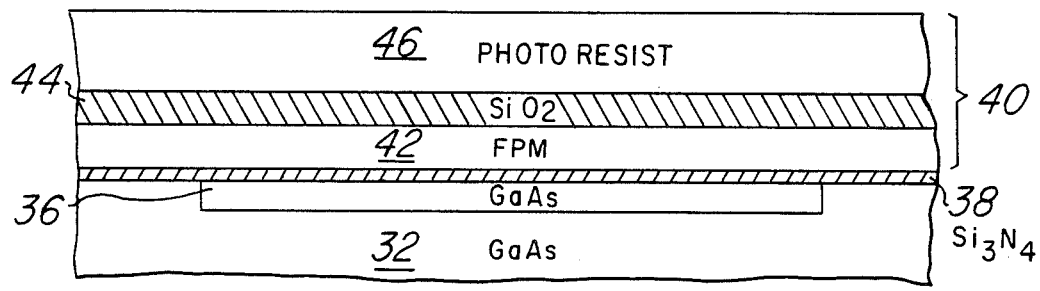
Figure 2C:
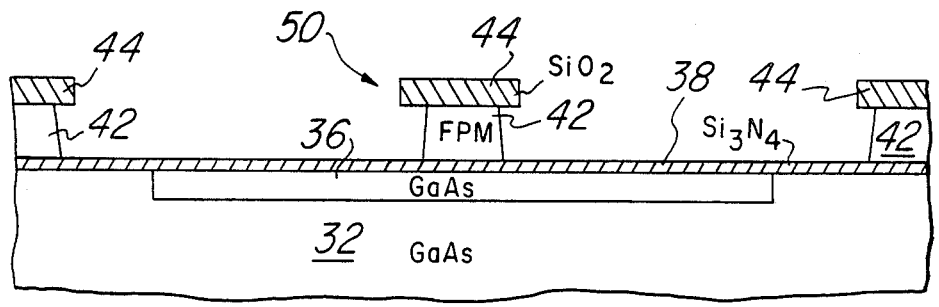
Figure 2D:
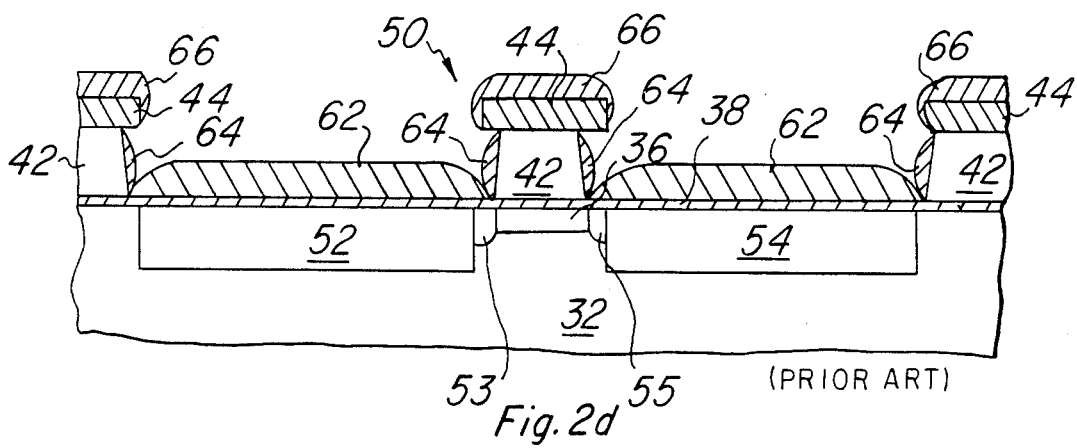
Figure 2E:
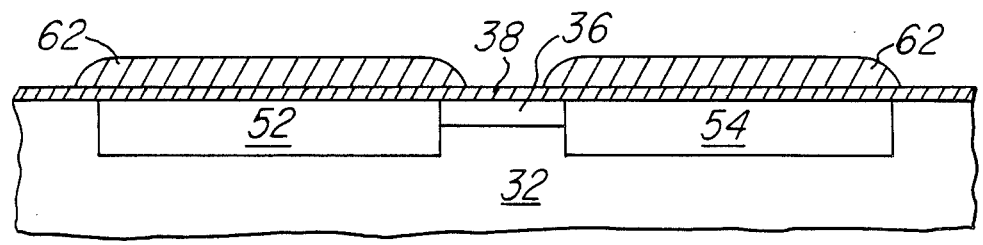
Figure 2F:
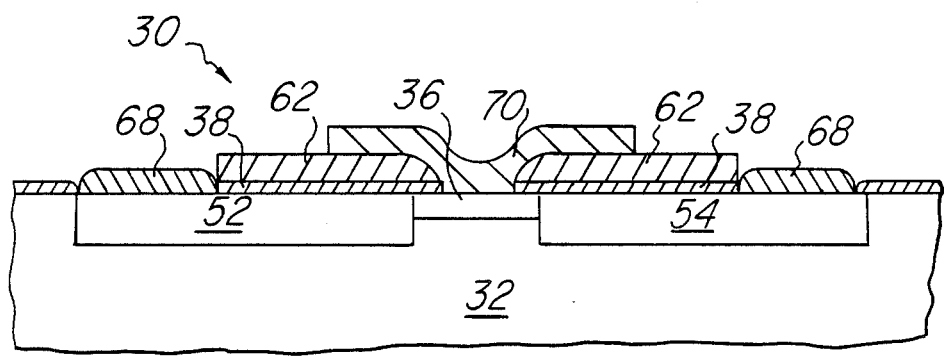
Figure 3A:
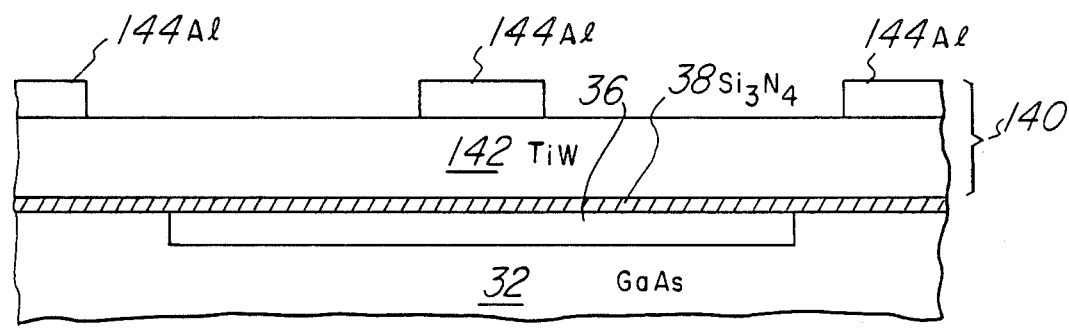
FIGS. 3A-C illustrate the first preferred embodiment method in cross sectional elevation view.
Figure 3B:
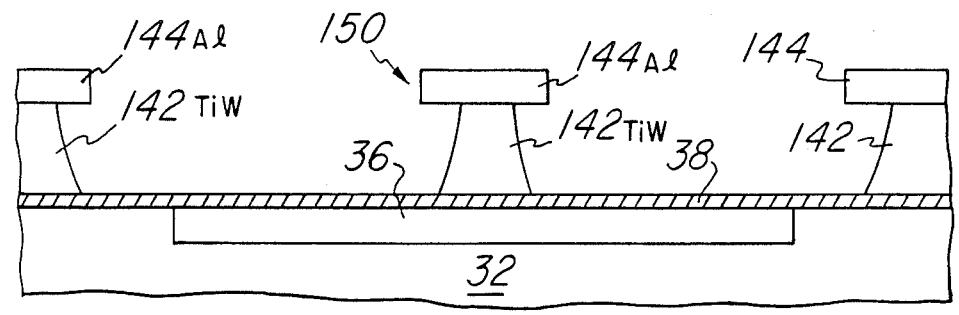
Figure 3C:
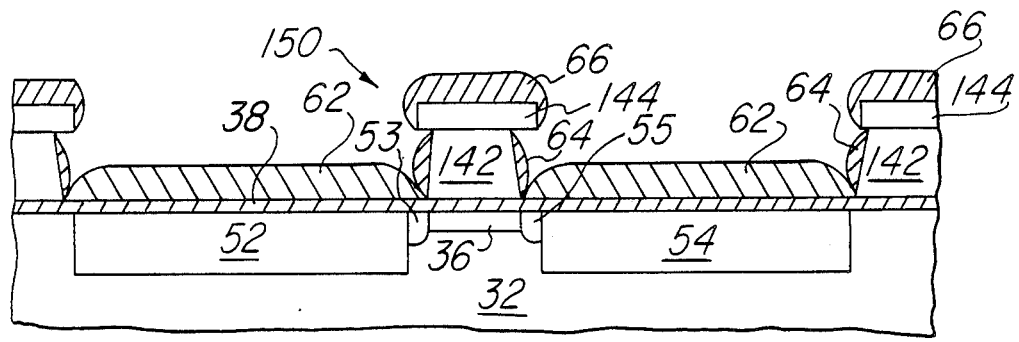

FIG. 1 is a flow graph for the steps of a first preferred embodiment method of fabrication for a GaAs MESFET. Details of the steps are described in connection with the discussion of FIGS. 3A-C, but first an explanation of the SAINT method is necessary.

FIGS. 2A-F illustrate in schematic cross sectional elevation view the steps in the SAINT method:

(a) Semi-insulating GaAs substrate 32 is coated with photoresist 34 (AZ1450J) which is patterned to define the active areas 36; the areas are then implanted with a silicon dose of about $2 \times 10^{12}/cm^2$ at 60 keV. See FIG. 2A.

(b) Next, photoresist 34 is removed, 0.15 $\mu$m thick layer 38 of silicon nitride is deposited by plasma-enhanced CVD, and tri-level resist 40 is formed: tri-level resist 40 consists of 0.8 $\mu$m thick layer 42 of spun-on FPM (or PMMA), 0.3 $\mu$m thick layer 44 of sputtered $SiO_2$ (or germanium), and a top layer 46 of spun-on photoresist. See FIG. 2B.

(c) The top layer of photoresist 46 of tri-level 40 is patterned to define the dummy gate and source and drain, and $SiO_2$ layer 44 is reactive ion etched with $CF_4 + H_2$ using the patterned photoresist 46 as etch mask. Then FPM layer 42 is reactive ion etched with $O_2$; during the reactive ion etching photoresist layer 46 is etched away and the FPM is undercut to create an overhang by $SiO_2$ 44. See FIG. 2C which shows dummy gate 50 in the center. The amount of overhang by $SiO_2$ 44 can be adjusted by controlling the amount of undercut of FPM 42.

(d) Source 52 and drain 54 are now formed by implanting a dose of about $4 \times 10^{13}$ /cm$^2$ at 200 keV through silicon nitride layer 38 and using SiO$_2$ layer 44 as the implant mask; the overhang of layer 44 determines the distance between the foot of dummy gate 50 (FPM 42) and source 52 and drain 54. Then 0.3 $\mu$m thick layer 62 of SiO$_2$ is sputter deposited; this deposition also creates sidewall SiO$_2$ 64 which is typically 100 Å thick on FPM 42 and breadloaf-type SiO$_2$ deposits 66 on layer 44. See FIG. 2D. Note that dummy gate 50 may sag due to the temperatures of the SiO$_2$ sputter deposition. Deposition of SiO$_2$ 62 under the overhang of layer 44 at the foot of dummy gate 50 is necessary to provide the eventual gate-to-source separation, so a perfectly vertical deposition is unworkable and sidewall SiO$_2$ 64 is effectively unavoidable.

(e) Dummy gate 50 can be removed by dissolving FPM 42 to lift-off SiO$_2$ 44 and 66, but first sidewall SiO$_2$ 64 must be removed to expose FPM 42. Thus a short etch with buffered HF (Common Oxide Etch) is used to remove sidewall SiO$_2$ 64, but the etch also undercuts the FPM base of dummy gate 50 (note that sidewall SiO$_2$ 64 is thinner at the foot of dummy gate 50) and attacks silicon nitride 38. After the removal of sidewall SiO$_2$ 64, dummy gate 50 is removed by dissolution of FPM 42; see FIG. 2E.

(f) Lastly, the implants are activated by an anneal at 800° C.; source and drain contact openings are cut in SiO$_2$ 62/silicon nitride 38; ohmic metal 68 is deposited and lifted off; plasma etch the exposed portion of silicon nitride layer 38 down to GaAs 36 with SiO$_2$ 62 providing the mask; and gate 70 is formed by titanium/platinum/gold deposition and lift-off. See FIG. 2F for completed MESFET 30.

The first preferred embodiment method of fabrication is analogous to the SAINT method but uses a two-level metal resist instead of the tri-level resist 40 as follows:

(a) The active area 36 is formed (FIG. 2A) and silicon nitride layer 38 of thickness 0.05 $\mu$m is deposited as in SAINT. Next, two-level resist 140 is formed by sputter deposition of alloy of 90% tungsten with 10% titanium (TiW) 142 to a thickness of 0.3 $\mu$m followed by spinning on and patterning photoresist for deposition and liftoff of 0.1 $\mu$m thick aluminum 144. The pattern of aluminum 144 regions defines the source and drain areas analogous to the patterning of photoresist 46 in SAINT step (c); see FIG. 3A in which the length (left to right) of aluminum 144 in the center of the figure is 1.5 $\mu$m. The aluminum 144 lift-off can be either silicon nitride assisted or with single or double level deep ultraviolet exposed resists; if nitride assisted lift-off is used, then the nitride is plasma etched off after the aluminum is lifted off. The titanium is alloyed with the tungsten to lessen the brittleness of the tungsten.

(b) TiW 142 is etched using a 30% solution of H$_2$O$_2$; this undercuts aluminum 144 and is a very slow, highly controllable etch to form dummy gate 150. The 0.3 $\mu$m of TiW takes about twenty minutes to etch, and thus the amount of undercut can be easily adjusted. See FIG. 3B in which the foot of dummy gate 150 is 1.0 $\mu$m long.

(c) Source 52 and drain 54 are formed by implanting Si through silicon nitride layer 38; by adjusting the implant energy, the Si can also penetrate aluminum 144 to form a lighter doped extensions 53 and 55 of source 52 and drain 54, respectively, to improve the breakdown voltage of resulting MESFET 30. Note that for digital circuitry MESFETs do not have applied voltages greater than about 1 volt, so the depletion region in the GaAs about the Schottky gate effectively prevents lighter doped extensions 53 and 55 from forming short circuits to the gate. Next, SiO$_2$ 62 is sputter deposited to a thickness of 0.15 $\mu$m; as in SAINT, SiO$_2$ 64 deposits on the sidewalls of TiW 142 and forms a breadloaf-type deposit 66 on aluminum 144. See FIG. 3C. Note that dummy gate 150 is all metal and is not affected by the sputtering temperatures. Alternatively, the SiO$_2$ could be deposited by plasma CVD or evaporation.

(d) Sidewall SiO$_2$ 64 is removed by a short etch (about ten seconds) in dilute buffered HF. Note that TiW 142 is impervious to this etch and adheres very well to nitride layer 38, so no undercutting occurs. Once sidewall SiO$_2$ 64 is removed, aluminum 144 is dissolved in an aqueous solution of NaOH, and TiW 142 is dislloved in H$_2$O$_2$. This leaves the same structure as the completion of step (e) of SAINT; see FIG. 2E. The annealing, ohmic contacts, and Schottky gate formation are as in SAINT; see FIG. 2F. Note that silicon nitride 38 provides a cap on the GaAs during the annealing. Since dummy gate 150 had aluminum 144 of length 1.5 $\mu$m and foot of length 1.0 $\mu$m, the resulting MESFET 30 has a gate length of 1.0 $\mu$m with a gate-to-source and gate-to-drain separation of 0.25 $\mu$m.

Figure 4A:
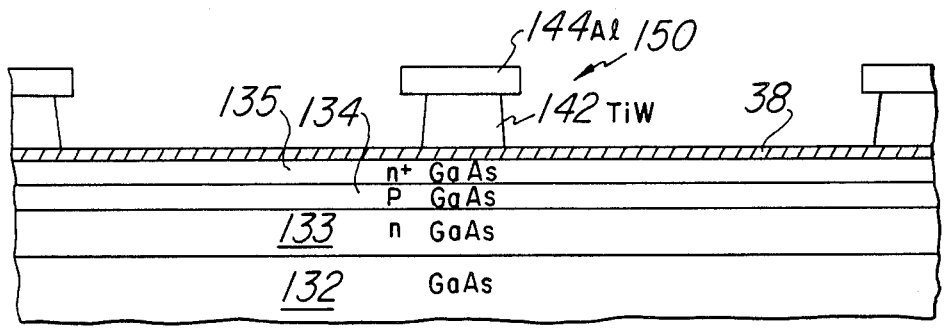
FIGS. 4A-C illustrate the second preferred embodiment method in cross sectional elevation view.

The second preferred embodiment method of fabrication is for vertical bipolar transistors and the dummy gate of the first preferred embodiment method becomes a mask for a self-aligned external base implant as follows:

(a) Begin with a GaAs substrate 132 with n collector layer 133, p base layer 134, and n+ emitter layer 135 and then deposit silicon nitride layer 38 and form dummy structure 150 made of TiW 142 and aluminum 144 as in the first preferred embodiment method steps (a)–(b). See FIG. 4A.

Figure 4B:
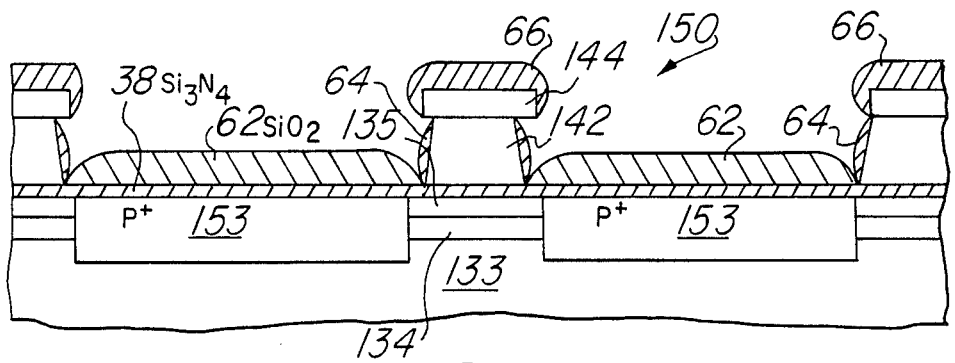

(b) Implant Be to form p+ external base 153 with dummy structure 150 as implant mask. The Be implant must be of sufficient dose to convert the implanted portion of layer 135 to p+. Sputter deposit SiO$_2$ 62, 64 and 66; see FIG. 4B.

Figure 4C:
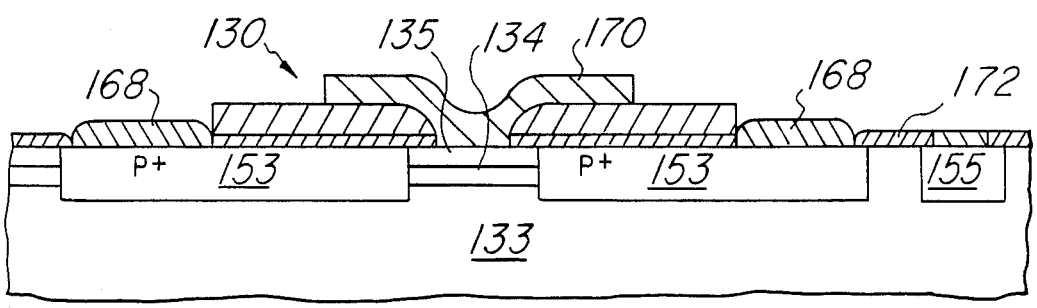

(c) Proceed as in first preferred embodiment method steps (c)–(d) to remove dummy structure 150, form ohmic external base contacts 168 and form emitter contact 170. Note that the distance between emitter contact 170 and external base 153 is determined by the overhang of dummy structure 150. The collector contact could be backside or by mesa formation or by an additional implant convert a portion of layer 234 to n type. See FIG. 4C for bipolar transistor 130 which has the additional n implant 155 for collector surface contact 172.

MODIFICATIONS AND ADVANTAGES

Various modifications of the preferred embodiment methods may be made while retaining the feature of an all metal dummy structure for self-alignment. For example, the dimensions and shapes of the layers and the dummy structures could be varied widely, such as the 1.0 $\mu$m long foot of dummy gate 150 could be reduced to 0.2 $\mu$m by extending the undercut of the TiW. In this manner submicron features may be fabricated with optical lithography. Another example is the use of plasma etching in place of the wet etches of the preferred embodiments, such as CHCl$_3$ for plasma etching aluminum. The selectivity of the etches is probability better with wet etches, but selectivities do not have to be extraordinary because the dimensions of the structure can be designed to compensate for lower selectivity.

Further various materials could be used, such as nickel or an alloy of 96% aluminum and 4% copper could be used in place of the aluminum and various amounts of titanium in the tungsten could be used; and the GaAs substrate could be $Al_xGa_{1-x}As$, GaP, CdTe, Si or other semiconductors or more complex structures such as epitaxially GaAs grown on Si or GaAs on Si-on-sapphire; and the silicon dioxide and silicon nitride could be replaced by two other dielectrics provided that the appropriate selective etches are available. A third (or more) layer could be added to the dummy structure; and the silicon nitride layer could be omitted, except without the silicon nitride acting as a cap during the annealing of the implants some other provision such as an arsenic atmosphere would be needed. In the case that the silicon nitride layer is omitted, the silicon dioxide could be replaced by silicon nitride.

MESFETs with offset gates can also be formed with the inventive method by using a angled deposition of aluminum after the dummy gate 150 has been removed; the shadow of the silicon dioxide 62 will leave an offset opening in the deposited aluminum which is then used to etch an opening in the silicon nitride 38 for the gate metal to contact the channel.

The inventive methods have the advantages of metal dummy structures which are not affected like resists by high temperature processing and have good adherence to avoid undercutting during etching of the sidewall deposits.

What is claimed is:

1. A method of self-aligned semiconductor device fabricaton, comprising the steps of:
    (a) form a layer of a first dielectric on a semiconductor substrate;
    (b) form a layer of a first metal on said layer of first dielectric;
    (c) form patterned layer regions of a second metal on said first metal;
    (d) etch said first metal with an etchant that does not substantially etch said second metal or said first dielectric; said etching continued until all of said first metal is removed except for that portion of said first metal which is both beneath said patterned layer regions and at least a predetermined distance from the closest edge of said patterned layer regions;
    (e) implant dopants through said layer of first dielectric into said substrate to form doped regions in said substrate, said patterned layer regions and said first metal acting as an implant mask;
    (f) deposit a second dielectric on the exposed portion of said layer of first dielectric;
    (g) remove all of said first metal, thereby leaving an opening in said second dielectric which is aligned with said doped regions and is said predetermined distance from them;
    (h) remove the exposed portion of said layer of first dielectric to extend said opening to said substrate;
    (i) deposit a first contact in said opening and contacting said substrate; and
    (j) form further contacts to portions of said substrate away from said first contact.

2. The method of claim 1, wherein:
    (a) said first metal is titanium tungsten; and
    (b) said second metal is aluminum.

3. The method of claim 2, wherein:
    (a) said first dielectric is silicon nitride;
    (b) said second dielectric is silicon dioxide;
    (c) said semiconductor substrate is GaAs in the vicinity of said layer of first dielectric.

4. The method of claim 2, wherein:
    (a) said etchant is hydrogen peroxide solution.

5. The method of claim 1, wherein:
    (a) said implant of dopants includes some dopants passing through said patterned layer regions and through said first dielectric but not through said first metal layer to form a lighter doped extensions of said doped regions.

6. A method of self-aligned semiconductor device fabrication, comprising the steps of:
    (a) form a layer of a first metal on a semiconductor substrate;
    (b) form patterned layer regions of a second metal on said first metal;
    (c) etch said first metal with an etchant that does not substantially etch said second metal or said substrate; said etching continued until all of said first metal is removed except for that portion of said first metal which is both beneath said patterned layer regions and at least a predetermined distance from the closest edge of said patterned layer regions;
    (d) implant dopants into said substrate to form doped regions in said substrate, said patterned layer regions and said first metal acting as an implant mask;
    (e) deposit a dielectric on the exposed portion of said substrate;
    (f) remove all of said first metal, thereby leaving an opening in said dielectric which is aligned with said doped regions and is said predetermined distance from them;
    (g) deposit a first contact in said opening and contacting said substrate; and
    (h) form further contacts to portions of said substrate away from said first contact.

7. The method of claim 6, wherein:
    (a) said first metal is titanium tungsten; and
    (b) said second metal is aluminum.

8. The method of claim 7, wherein:
    (a) said dielectric is silicon dioxide; and
    (b) said semiconductor substrate is GaAs in the vicinity of said dielectric.

9. The method of claim 7, wherein:
    (a) said etchant is hydrogen peroxide solution.

10. The method of claim 6, wherein:
    (a) said implant of dopants includes some dopants passing through said patterned layer regions but not through said first metal layer to form a lighter doped extensions of said doped regions.

* * * * *